(12) United States Patent
Yun

(10) Patent No.: US 7,413,923 B2
(45) Date of Patent: Aug. 19, 2008

(54) METHOD OF MANUFACTURING CMOS IMAGE SENSOR

(75) Inventor: Jun Han Yun, Jongno-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 213 days.

(21) Appl. No.: 11/475,377

(22) Filed: Jun. 27, 2006

(65) Prior Publication Data

US 2006/0292733 A1    Dec. 28, 2006

(30) Foreign Application Priority Data

Jun. 27, 2005    (KR) .................... 10-2005-0055589

(51) Int. Cl.
*H01L 21/00* (2006.01)

(52) U.S. Cl. .................. 438/70; 438/57; 438/69; 438/71; 438/72; 257/431; 257/432; 257/440; 257/443; 257/444

(58) Field of Classification Search ............... 438/57, 438/69–72; 257/431, 432, 440, 443, 444
See application file for complete search history.

(56) References Cited

U.S. PATENT DOCUMENTS

| | | | |
|---|---|---|---|
| 5,396,090 A * | 3/1995 | Nakai .................... 257/233 |
| 6,043,481 A * | 3/2000 | Tan et al. .................... 250/216 |
| 6,933,167 B2 * | 8/2005 | Yamamoto .................... 438/69 |
| 7,084,472 B2 * | 8/2006 | Fukuyoshi et al. .......... 257/432 |
| 7,264,976 B2 * | 9/2007 | Deng et al. .................... 438/7 |
| 7,279,354 B2 * | 10/2007 | Hwang ........................ 438/70 |
| 2004/0147059 A1 * | 7/2004 | Jeong et al. .................... 438/70 |
| 2006/0145224 A1 * | 7/2006 | Lee ............................. 257/294 |
| 2006/0292734 A1 * | 12/2006 | Kim ............................ 438/70 |
| 2007/0238034 A1 * | 10/2007 | Holscher ........................ 430/7 |

* cited by examiner

*Primary Examiner*—M. Wilczewski
*Assistant Examiner*—Bac H Au
(74) *Attorney, Agent, or Firm*—Saliwanchik, Lloyd & Saliwanchik

(57) ABSTRACT

Provided is a manufacturing method of a CMOS image sensor. The method includes forming an interlayer insulating layer, a color filter layer, and a planarizing layer. A first photoresist is applied on the planarizing layer, and patterning of the first photoresist is performed using a first mask to form a microlens pattern corresponding to photodiodes on a semiconductor substrate. The microlens pattern is reflowed to form dome-shaped microlenses. A second photoresist is applied on the resulting substrate, and patterning of the second photoresist is preformed using a second mask to retain the second photoresist on top portions of the microlenses. Edge portions of the microlenses are selectively removed using the patterned second photoresist as a mask to make CD (critical dimension) spaces between the microlenses uniform.

19 Claims, 6 Drawing Sheets

METHOD OF MANUFACTURING CMOS IMAGE SENSOR

RELATED APPLICATION

This application claims the benefit, under 35 U.S.C. §119(e), of Korean Patent Application Number 10-2005-0055589 filed Jun. 27, 2005, which is incorporated herein by reference in its entirety.

FIELD OF THE INVENTION

The present invention relates to a method of manufacturing a CMOS image sensor.

BACKGROUND OF THE INVENTION

In general, an optical image sensor is a semiconductor device that converts an optical image to an electrical signal. Optical image sensors can largely be divided into charge coupled devices (CCD) and complementary metal oxide semiconductors (CMOS).

A CMOS image sensor incorporates a photo diode for detecting radiated light and a CMOS logic circuit that processes the detected light into electrical signal data. The more light a photodiode is capable of detecting, the better the image sensor's photosensitivity characteristics are.

The CMOS image sensor can be categorized by the number of transistors for each unit of the CMOS image sensor such as, for example as a 3T-type, a 4T-type, or a 5T-type.

Below, a manufacturing method of a CMOS image sensor according to the related art will be described, with reference to the diagrams.

FIGS. 1A through 1D are sectional views showing a manufacturing process of a CMOS image sensor according to the related art.

Referring to FIG. 1A, a plurality of light detecting modules, for example, photodiodes 12 are formed on a semiconductor substrate 11, on which an interlayer insulating layer 13 is formed.

Then, a dye resist is applied on the interlayer insulating layer 13, and exposing and developing processes are performed to form a color filter layer 14 with filters for filtering respective ranges of wavelengths.

Next, in order to adjust the focal distance and to form a lens layer on the color filter layer 14, a planarizing layer 15 is formed for ensuring flatness.

Referring to FIG. 1B, a resist layer 16a for forming a microlens is applied on the planarizing layer 15, and a reticle 17 having openings is arranged above the resist layer 16a.

Then, a laser is emitted through the reticle 17 to selectively expose the resist layer 16a corresponding to the openings of the reticle 17.

Referring to FIG. 1C, the exposed resist layer 16a forms a microlens pattern 16b.

Referring to FIG. 1D, the microlens pattern is made to reflow at a predetermined temperature to form the microlens 16.

Here, A and B denote respective spaces formed between microlenses 16. Because of the difficulty of controlling the reflow process, differences in critical dimension (CD) spaces arise between each microlens 16.

Therefore, the manufacturing method of a CMOS image sensor according to the related art has the following problem.

When a reflow process is performed to form dome-shaped microlenses, the CD spaces (A and B) are not uniform, resulting in a striation phenomenon of the microlenses.

SUMMARY OF THE INVENTION

Accordingly, the present invention is directed to a manufacturing method of a CMOS image sensor that addresses and/or substantially obviates one or more problems, limitations, and/or disadvantages of the related art.

An object of the present invention is to provide a manufacturing method of a CMOS image sensor that evenly forms CD spaces between microlenses to prevent the occurrence of striation.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a manufacturing method of a CMOS image sensor including: forming an interlayer insulating layer on the surface of a semiconductor substrate having at least one photodiode and a transistor formed therein; forming a color filter layer on the interlayer insulating layer, the color filter layer incorporating a color filter corresponding to each photodiode; forming a planarizing layer on the color filter layer; applying a first photoresist on the planarizing layer; patterning the first photoresist using a first mask to form a microlens pattern corresponding to the photodiodes; reflowing the microlens pattern to form dome-shaped microlenses; applying a second photoresist on the resulting substrate; patterning the second photoresist using a second mask to form a second photoresist pattern on top portions of the microlenses; and selectively removing edge portions of the microlenses using the second photoresist pattern as a mask to make CD (critical dimension) spaces between the microlenses uniform.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A through 2H are sectional views showing a manufacturing process of a CMOS image sensor according to an embodiment of the present invention.

Figure 1A:
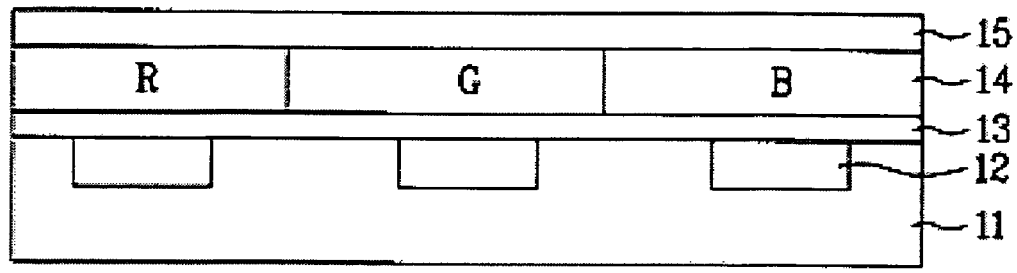
FIGS. 1A through 1D are sectional views showing a manufacturing process of a CMOS image sensor according to the related art.
Figure 1B:
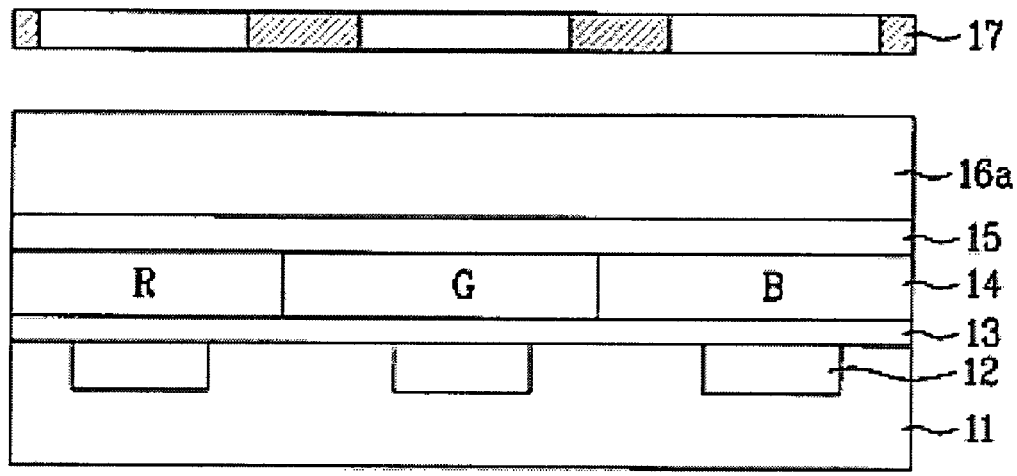
Figure 1C:
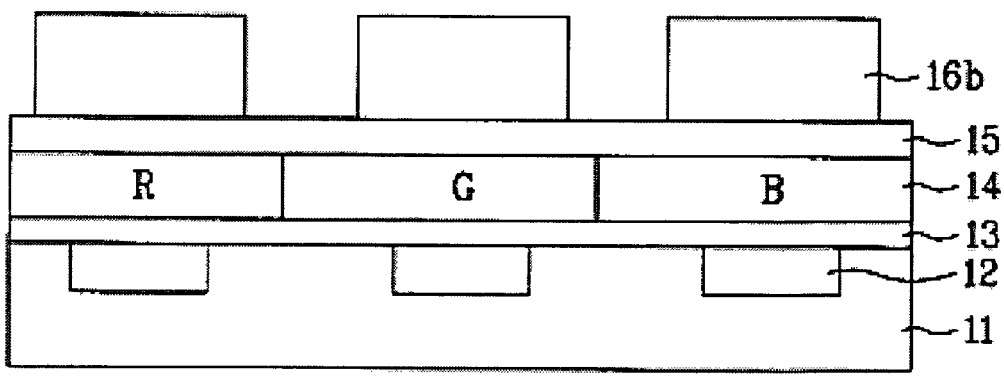
Figure 1D:
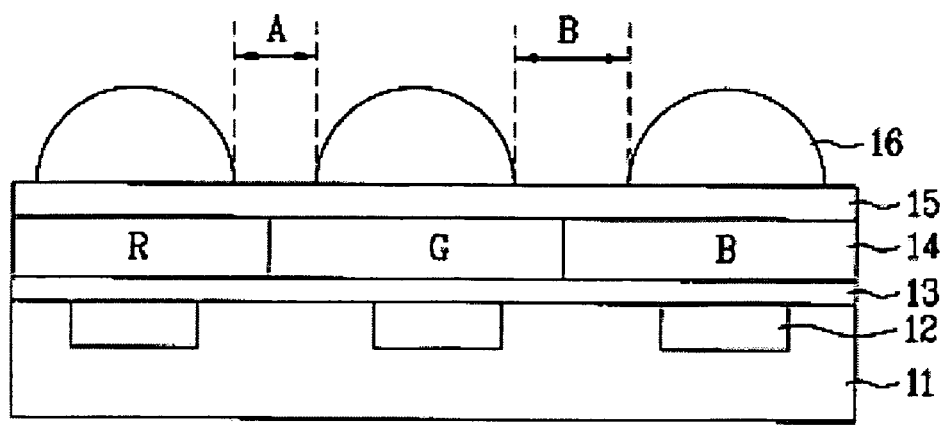
Figure 2A:
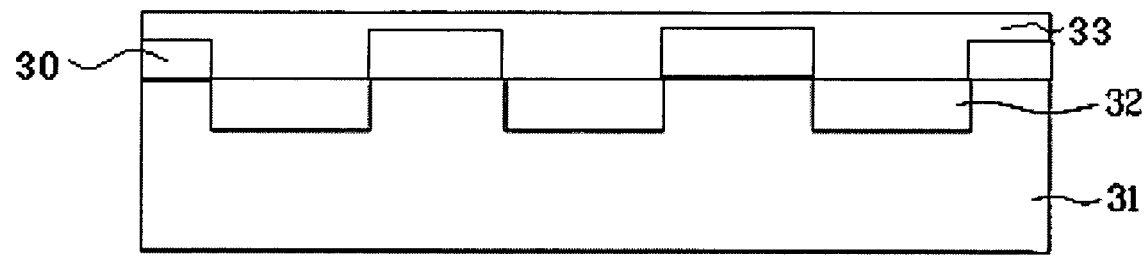
FIGS. 2A through 2H are sectional views showing a manufacturing process of a CMOS image sensor according to an embodiment of the present invention.

Referring to FIG. 2A, an interlayer insulating layer 33 can be formed on a semiconductor substrate 31 incorporating a plurality of light detectors (for example, photodiodes 32) and various transistors formed thereon.

In one embodiment, the interlayer insulating layer 33 can be formed as a multi layer. In another embodiment, the interlayer insulating layer 32 can incorporate a light blocking layer for blocking incident light between photodiode regions. In such an embodiment, a first interlayer insulating layer can be formed on the substrate and photodiodes 32, a light blocking layer (30) can then be formed on the first interlayer insulating layer, and a second interlayer insulating layer can be formed thereupon.

In a further embodiment, a protective layer (not shown) can be formed on the interlayer insulating layer 33 to protect the latter from moisture and scratches. The protective layer can be an organic layer that is deposited as a thin film with a thickness of about 50 nm and less, and is then hard cured.

In a specific embodiment, the protective layer can be formed with an organic substance having superior transparency to visible ray wavelengths to provide evenness of the color filter layer 34 (to be formed later).

Figure 2B:
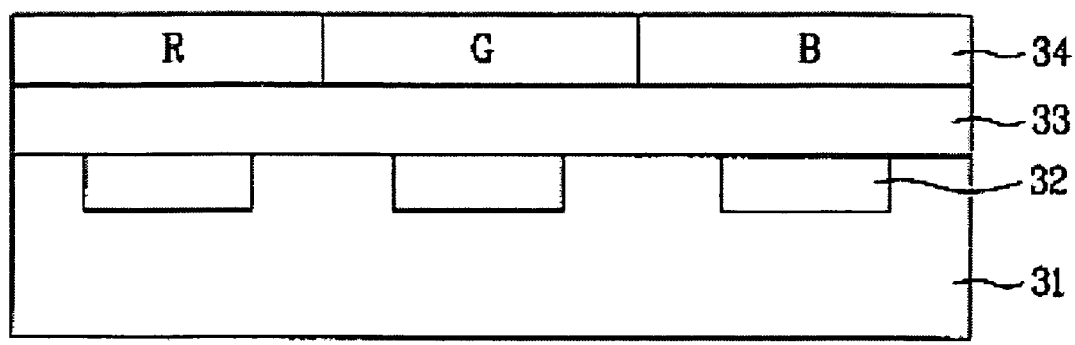

Referring to FIG. 2B, a dye resist can be applied on the interlayer insulating layer 33. Then, exposing and developing processes can be performed to form a color filter layer 34 incorporating color filters of red (R), green (G), and blue (B) for filtering respective wavelengths of light.

In a specific embodiment, a single color filter layer 34 that filters respective ranges of light wavelengths can be formed by applying a photosensitive material such that the color filters have a thickness of 1-5 μm, and patterning the color filters through a photo etching process using a separate mask.

Figure 2C:
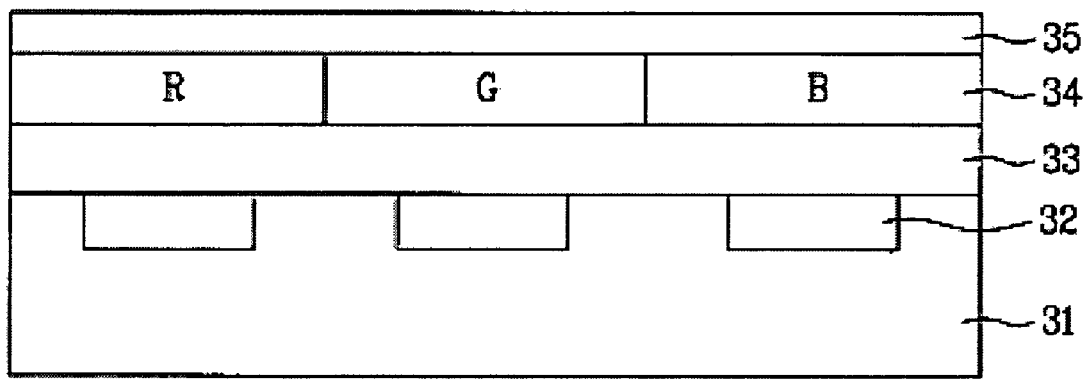

Referring to FIG. 2C, once the color filters R, G, B are formed in the color filter layer 34, a planarizing layer 35 can be formed on the color filter layer 34. In a specific embodiment, the planarizing layer 35 can be a silicon nitride layer. The silicon nitride layer can be used to increase reliability and prevent moisture and heavy metal infiltration.

Because optical transparency of an image sensor is very important, in order to eliminate interference between thin films caused by a thick planarizing layer 35, the planarizing layer 35 can be formed to a thickness of 1000-6000 Å.

In one embodiment, a bonding pad for wiring can be formed in a pad and scribe line portion of the planarizing layer 35 using a photoresist as a mask. In embodiments, the bonding pad (not shown) can be formed through dry or wet etching.

The first planarizing layer 35 can be hardened by performing a heat treatment at a temperature of between 150-300° C.

Figure 2D:
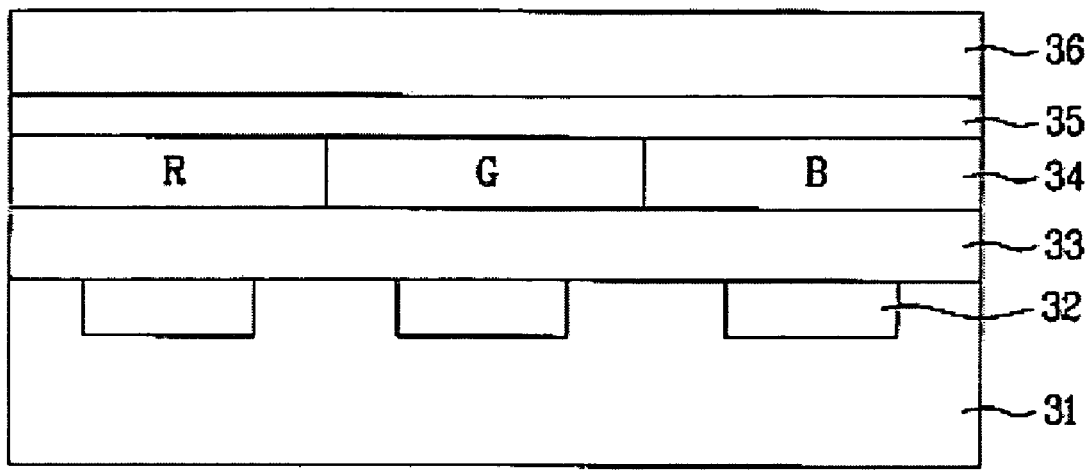

Referring to FIG. 2D, a first photoresist 36 can be applied on the planarizing layer 35.

Figure 2E:
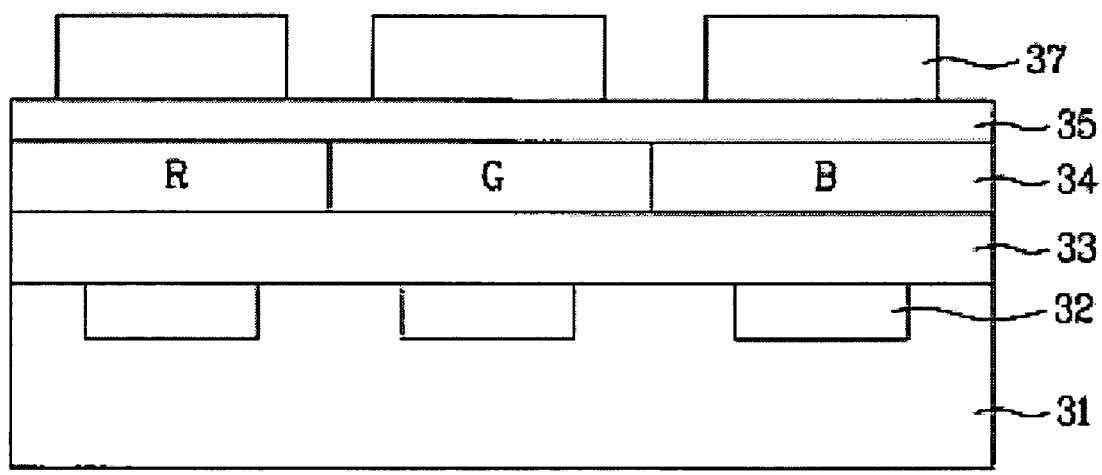

Referring to FIG. 2E, a mask (not shown) for a microlens pattern can be used to selectively pattern the photoresist 36 and form a microlens pattern 37 through an exposure and development process.

According to embodiments of the present invention, the photoresist 36 for a microlens can be a negative photoresist or a positive photoresist.

For embodiments where the photoresist 36 is a positive resist, the photo active compound remaining in the microlens pattern can be dissolved through flood exposure because transparency improves when a photo active compound of an initiator, or absorbing material, of the photoresist 36 is dissolved.

After transparency is increased through flood exposure of the microlens pattern 37, the flow ability of the microlens is increased because of the release of photo acid.

Figure 2F:
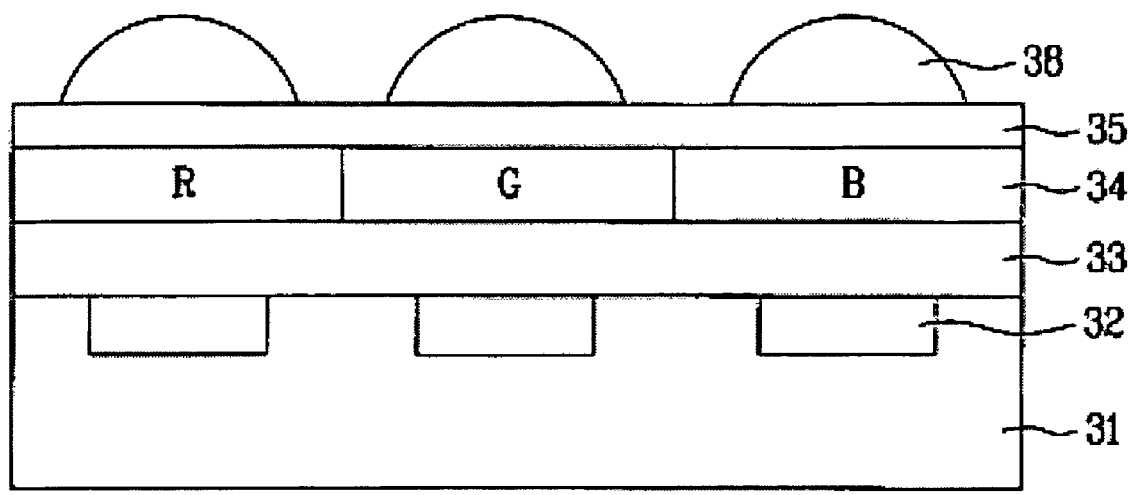

Referring to FIG. 2F, the semiconductor substrate 31 with the microlens pattern 37 formed thereon can be placed above a hot plate (not shown) and heat treated at 150° C. or above to allow the microlens pattern 37 at the top of the semiconductor substrate 31 to reflow and form dome-shaped microlenses 38. In one embodiment, the reflow can be performed at about 300-700° C.

Then, the microlenses 38 that have undergone reflowing can be cooled. In an embodiment, the cooling can be performed while the semiconductor substrate 31 is placed above a cool plate.

Figure 2G:
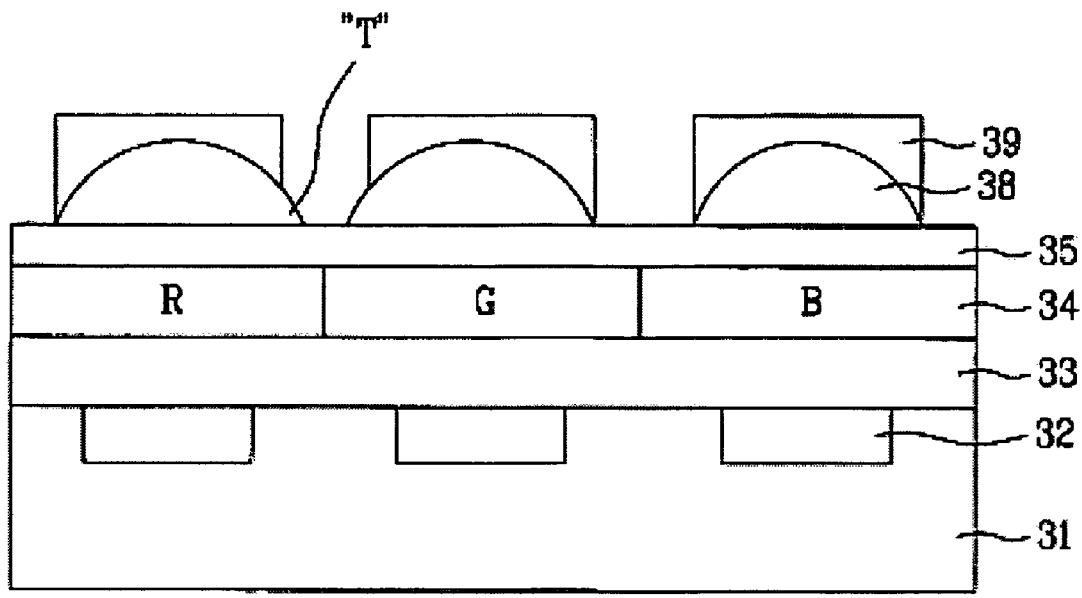

Referring to FIG. 2G, a negative photoresist 39 can be applied to the surface of the semiconductor substrate including the microlenses 38. A second mask (not shown) can be used to pattern the negative photoresist 39 through exposure and developing processes so that the negative photoresist remains only on the top portions of the microlenses 38.

In a specific embodiment, the second mask can have a pattern exactly opposite to that of the first mask.

In a further embodiment, before the negative photoresist is applied 39, UV rays can be radiated on the microlenses 38 so that when the negative photoresist 39 is applied, there is no reaction between the microlenses 38 and the negative photoresist 39.

Due to instability of the process of reflowing the microlens pattern 37, the CD spaces between the microlenses 38 appear non-uniform. That is, tail (T) portions of the edges of the microlenses 38 appear (as shown in FIG. 2G), so that the CD spaces between the microlenses 38 become unstable and the uniformity of the microlenses 38 decreases as well.

Accordingly, in order to overcome the non-uniformity of the CD spaces between the microlenses 38, the present invention applies a negative photoresist 39 with characteristics opposite to the microlenses 39, and performs a patterning process.

Although the first photoresist 36 is described in the embodiments above as a positive photoresist and the second photoresist 39 is described in the embodiments above as a negative photoresist, other photoresists can be used.

In particular, in the manufacturing of the CMOS image sensor according to an alternate embodiment of the present invention, the microlenses 38 can be formed of a positive photoresist 36, and a negative photoresist 39 can be formed on the microlenses 38.

The negative photoresist and the positive photoresist used in embodiments of the present invention can have the following characteristics.

The negative photoresist can be a mixture of a hardened rubber-based resin and a bisdiazide-based compound contained in an organic solvent. The bisdiazide-based compound is a photosensitive material and is used as a crosslink agent.

The light radiated portion of the negative photoresist becomes a meshed structure and can be hardened through the crosslink agent. A pattern can be formed using a difference in solubility of development between the radiated portion and the non-radiated portion.

The light radiated portion of the positive photoresist can be dissolved in a developer (alkaline), and a pattern can be formed as in the negative photoresist through the insolubility of the non-radiated portions, using the discrepancies in solubility.

Generally, the positive photoresist can be a mixture made of a quinonediazide-based photosensitive material, an alkaline soluble phenol-based resin, and an organic solvent. The mixture itself is not soluble in alkaline, but is made soluble in alkaline through the radiation of light.

Figure 2H:
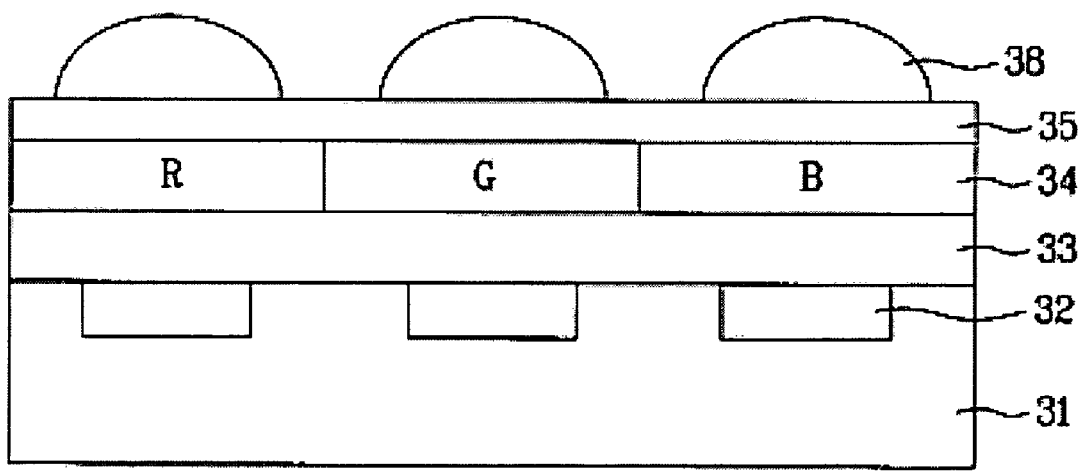

Referring to FIG. 2H, when the microlenses 38 are formed using the patterned negative photoresist 39 as a mask, the tails (T) of the microlenses 38 that occur as a result of the reflow process can be removed. Therefore, the CD spaces can be uniformly made between the microlenses 38.

Then, the negative photoresist 39 can be removed, a wet cleaning of the semiconductor substrate 31 can be performed, and polymer and other impurities that are created during fabrication can be removed.

In further embodiments of the present invention, during the selective removal of edge portions of the microlenses 38, the planarizing layer 35 that is exposed between the microlenses 38 can be selectively over-etched to eliminate gaps between the etched microlenses 38.

The above-described manufacturing method of the CMOS image sensor according to the present invention has the following advantages.

The manufacturing process of the CMOS image sensor according to an embodiment of the present invention uses a positive photoresist to form microlenses 38, and then forms a negative photoresist 39 (having characteristics opposite to the positive photoresist) on the microlenses 38 in order to remove tails (T) of the microlenses that appear during reflow processing increase the uniformity of the microlenses 38.

Moreover, by making the CD spaces between the microlenses uniform, the present invention removes the striation phenomenon occurring on the microlenses, ensures uniformity of the microlenses, and increases overall color reproduction.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing a CMOS (complementary metal oxide semiconductor) image sensor, comprising:
    forming an interlayer insulating layer on a surface of a semiconductor substrate having at least one photodiode and a transistor;
    forming a color filter layer above the interlayer insulating layer;
    forming a planarizing layer on the color filter layer;
    applying a first photoresist on the planarizing layer;
    patterning the first photoresist using a first mask to form a microlens pattern;
    reflowing the microlens pattern to form dome-shaped microlenses;
    applying a second photoresist on the resulting substrate including the microlenses;
    patterning the second photoresist using a second mask to form a second photoresist pattern on top portions of the microlenses; and
    selectively removing edge portions of the microlenses using the second photoresist pattern as a mask.

2. The method according to claim 1, wherein the first photoresist is a negative photoresist, and the second photoresist is a positive photoresist.

3. The method according to claim 1, wherein the first photoresist is a positive photoresist, and the second photoresist is a negative photoresist.

4. The method according to claim 1, wherein the second mask has an opposite pattern to the first mask.

5. The method according to claim 1, wherein selectively removing edge portions of the microlenses comprises selectively over-etching the planarizing layer exposed between the microlenses and the over-etching eliminates a gap between the etched microlenses.

6. The method according to claim 1, further comprising radiating UV rays on the microlenses before applying the second photoresist.

7. The method according to claim 6, wherein radiating UV rays on the microlenses prevents reactions between the microlenses and the second photoresist.

8. The method according to claim 1, wherein the planarizing layer is formed of silicon nitride.

9. The method according to claim 1, wherein the planarizing layer is formed to a thickness of 1000-6000 Å.

10. The method according to claim 1, further comprising, removing the second photoresist after selectively removing edge portions of the microlenses.

11. The method according to claim 1, further comprising, cleaning the semiconductor substrate after selectively removing edge portions of the microlenses.

12. The method according to claim 1, further comprising forming a protective layer formed of an organic material.

13. The method according to claim 12, wherein the protective layer is formed to about 50 nm and less in thickness.

14. The method according to claim 1, further comprising hardening the planarizing layer at a temperature of 150-300° C.

15. The method according to claim 1, further comprising dissolving photo active compounds remaining in the microlens pattern through flood exposure on an entire surface of the microlens pattern.

16. The method according to claim 1, wherein reflowing the microlenses is performed at a temperature of 300-700° C.

17. The method according to claim 1, further comprising forming a light blocking layer within the interlayer insulating layer, wherein the interlayer insulating layer comprises a plurality of interlayer insulating layers, wherein forming the interlayer insulating layer and forming a light blocking layer within the interlayer insulating layer comprises:
    forming a first interlayer insulating layer;
    forming a light blocking layer on the first interlayer insulating layer in regions other than on the at least one photodiode; and
    forming a second interlayer insulating layer on the first interlayer insulating layer and the light blocking layer.

18. The method according to claim 1, wherein the color filter layer is formed 1-5 μm in thickness.

19. The method according to claim 1, wherein the selectively removing edge portions of the microlenses makes CD (critical dimension) spaces between the microlenses uniform.

* * * * *